United States Patent [19]
Merlin et al.

[11] Patent Number: 5,681,491
[45] Date of Patent: Oct. 28, 1997

[54] CHIP CARD HAVING INFORMATION ELEMENTS ETCHED IN A METAL CONTACT OF A CHIP CARD CONNECTOR

[75] Inventors: Pierre Merlin; Gérard Coiton, both of Venelles, France

[73] Assignee: Gemplus Card International, France

[21] Appl. No.: 591,177

[22] Filed: Jan. 16, 1996

Related U.S. Application Data

[62] Division of Ser. No. 111,136, Aug. 24, 1993, Pat. No. 5,552,574.

[30] Foreign Application Priority Data

Aug. 23, 1992 [FR] France .................................. 92 10296

[51] Int. Cl.⁶ .......................... B23K 26/00; B23K 26/18
[52] U.S. Cl. .................... 219/121.68; 219/121.74; 219/121.61; 235/487
[58] Field of Search ............... 219/121.68, 121.69, 219/121.59; 235/487–494, 449, 436

[56] References Cited

U.S. PATENT DOCUMENTS

| | | |
|---|---|---|
| 4,564,739 | 1/1986 | Mattelin . |
| 4,639,584 | 1/1987 | Adams et al. ............... 235/449 |
| 4,652,722 | 3/1987 | Stone et al. . |
| 4,675,498 | 6/1987 | Lemelson . |
| 4,701,591 | 10/1987 | Masaki et al. . |
| 4,735,670 | 4/1988 | Mauer et al. . |
| 4,831,244 | 5/1989 | Slater et al. ............... 235/487 |
| 4,904,853 | 2/1990 | Yokohawa ............... 235/487 |
| 4,908,937 | 3/1990 | Coiton . |
| 4,922,077 | 5/1990 | Gordon . |
| 4,990,759 | 2/1991 | Coiton . |
| 5,041,395 | 8/1991 | Steffen . |
| 5,103,073 | 4/1992 | Danilov et al. . |
| 5,157,235 | 10/1992 | Okumura et al. . |
| 5,353,296 | 10/1994 | Koop . |

FOREIGN PATENT DOCUMENTS

| | | |
|---|---|---|
| 2207459 | 6/1974 | France . |
| 3703809 | 8/1988 | Germany . |
| 1147531 | 4/1969 | United Kingdom . |
| 2240948 | 8/1991 | United Kingdom . |

OTHER PUBLICATIONS

Japan Patent Abstract No. 59-207246, vol. 9, No. 77, Apr. 1985.

Japan Patent Abstract No. 58-53444, vol. 7, No. 141, Jun. 1983.

"Beschriften mit Laserstrahlen," *Feinwerktechnik & Messtechnik*, F. Tuma, Jul. 1988, vol. 96, No. 7–8, pp. 308–310.

*Primary Examiner*—Mark H. Paschall
*Attorney, Agent, or Firm*—Nilles & Nilles, S.C.

[57] ABSTRACT

A chip card comprises a chip card body, a chip, and a connector. The connector has a metal contact which is electrically connected to the chip for communicating electrical signals. The metal contact includes a main layer which is free of etched information elements, and a coating layer which has information elements etched therein. In one improvement, the information elements are laser-etched. In another improvement, the information elements are also marked on the chip card body and are stored in the chip. The present invention advantageously helps protect against the fraudulent interchanging of the chip card micromodule, including the chip and the connector.

20 Claims, 2 Drawing Sheets

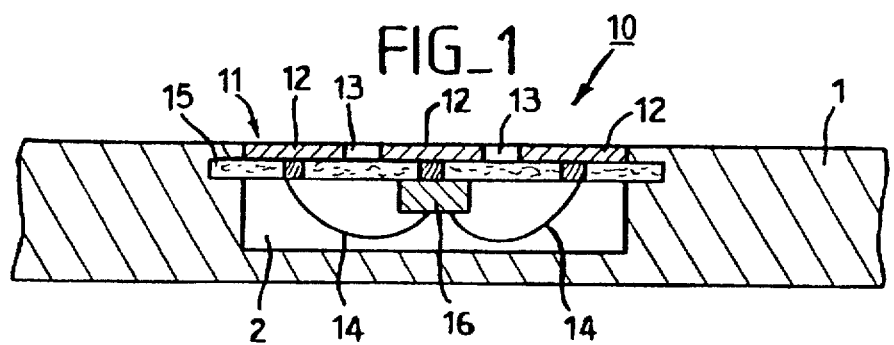
FIG_1
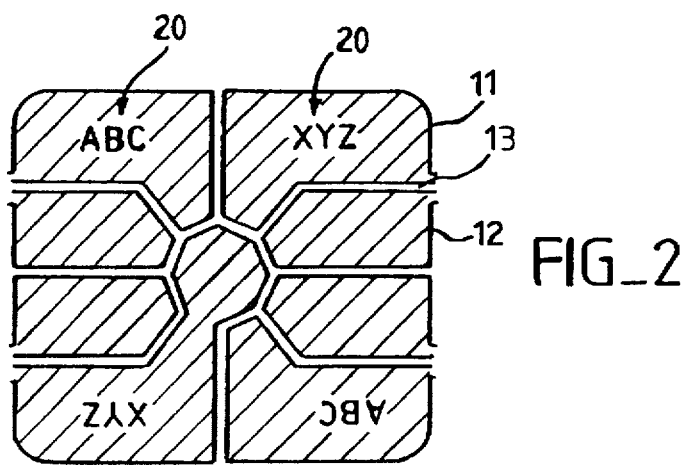
FIG_2
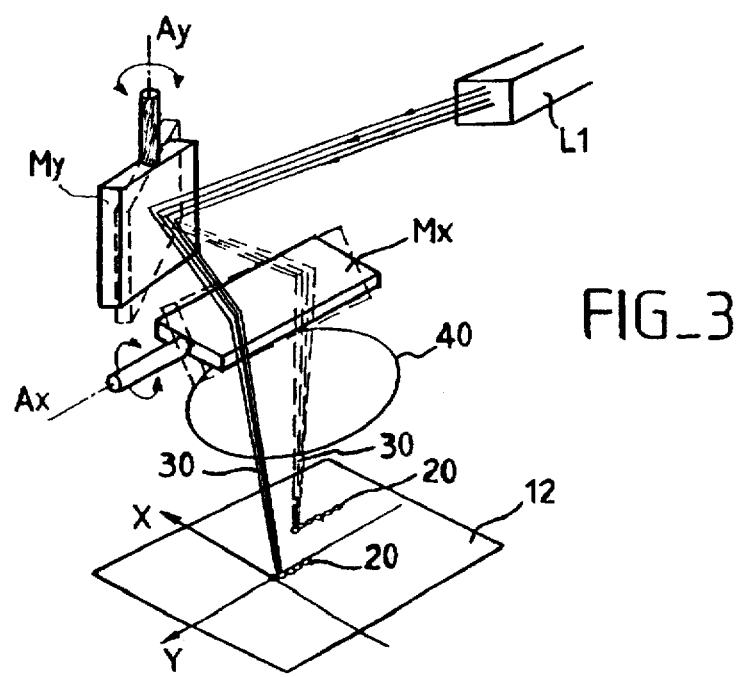
FIG_3

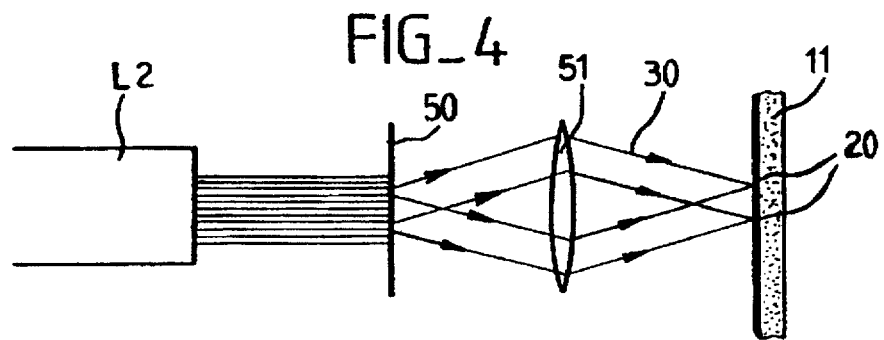
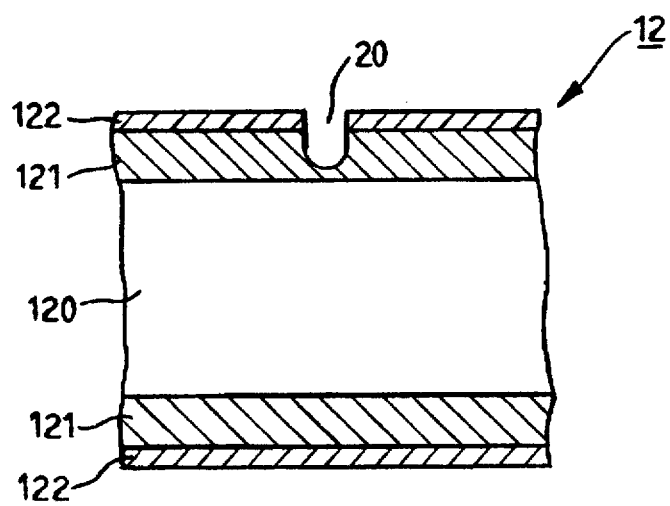
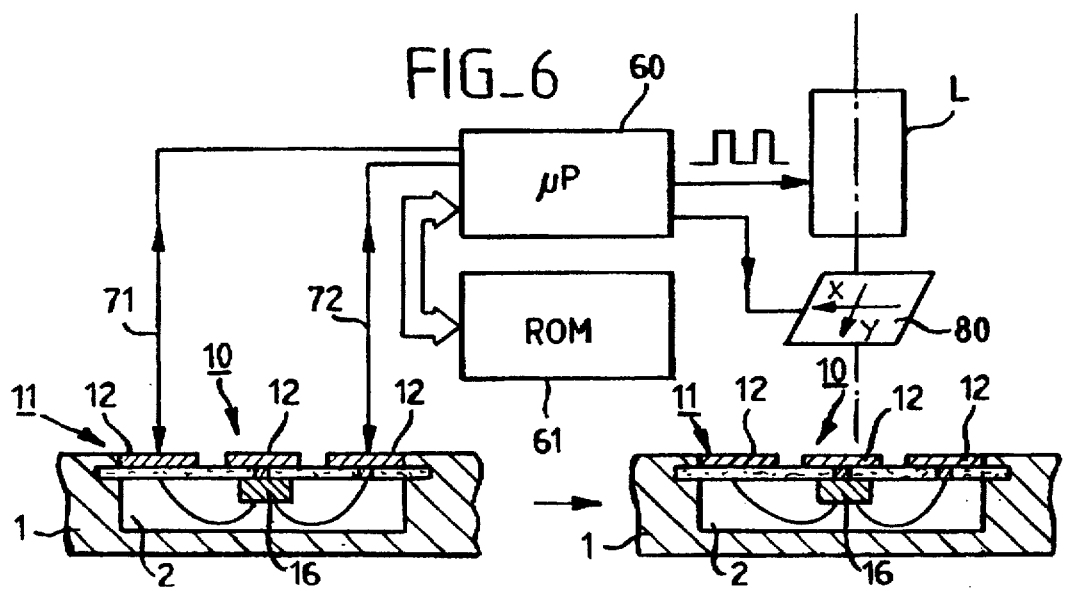

5,681,491

CHIP CARD HAVING INFORMATION ELEMENTS ETCHED IN A METAL CONTACT OF A CHIP CARD CONNECTOR

CROSS-REFERENCES TO A RELATED APPLICATION

This is a divisional application of Ser. No. 08/111,136, filed Aug. 24, 1993 and now U.S. Pat. No. 5,552,574.

BACKGROUND OF THE INVENTION

1. Field of the Invention

The present invention pertains to a chip card having information elements or particulars etched on a connector of the chip card, said connector having metal contacts with a given thickness.

The invention can be applied in a particularly advantageous way to the marking of electronic chip cards such as bank cards or telephone cards, for example, inter alia for the recording thereon of a security message or a manufacturer's identification.

In general, chip cards comprise micromodules that take the form of a supporting strip made of epoxyresin bearing, on one face, the electronic component (the chip) properly speaking and, on another face, an electrical connector constituted by metal contacts that are most usually made of copper, covered with a layer of nickel and a layer of gold. The micromodules are housed in cavities prepared in the thickness of the card, so as to leave said metal contacts accessible from the exterior.

2. Description of the Prior Art

At present the micromodules bear no particulars of any kind whatsoever. Only the manufacturer's corporate name sometimes appears on the card itself. Especially as regards to security, the total absence of identification allows the possibility of interchanging the micromodule and the body of the card.

A certain number of methods could be envisaged in order to carry out the marking of particulars on a micromodule and, more specifically, on the connector of said micromodule.

Marking by printing for example would consist in depositing layers of ink on the metal elements of the connector. However, this method would raise two problems, i.e. firstly, a problem of electrical contacts getting deteriorated because the inks are generally not conductive and, secondly, a problem of a certain degree of sensitivity to wear and tear on the part of the embossed etchings.

Mechanical etching would be incompatible with an already assembled micromodule because of the brittleness of the chip. Besides, it is almost impossible to conceive of an industrial-scale solution for this application.

Photoetching by chemical means does not enable the etching to be controlled in depth, and it is imperative that the coating of the metal contacts should not be penetrated too deeply.

Stamping, for its part, is not a process that can be carried out at any time whatsoever during the manufacturing process, which means that this technology has little flexibility.

Hence, the technical problem to be resolved by the object of the present invention is that of proposing a method for the marking of information elements or particulars on a connector of a card known as an electronic chip card, said connector having metal contacts of a given thickness, said method making it possible to obtain a lasting marking, without deterioration in the course of time, that would introduce no disturbance into the electrical contact and would not injure the electronic chip itself while at the same time retaining a high degree of flexibility, notably as regards the place of the marking operation in the card manufacturing cycle.

SUMMARY OF THE INVENTION

According to the present invention, the solution to the technical problem raised is one wherein the chip card connector is etched, with a laser beam, with the particulars in the thickness of the electrical contacts of the connector.

Thus, the use of a laser etching operation provides the following advantages:

the message constituted by etched particulars is indelible;

the fineness of the etching avoids causing deterioration in the function of the metal contacts. The coating is not entirely removed, in order to prevent the exposure of the contacts to corrosion;

the etching of the particulars can be inserted at any stage in the manufacturing process; on the epoxy resin film before the chips are mounted, on the film with assembled chips, on cutout micromodules or again on the cards themselves.

According to one particular mode of implementing the chip card which is the object of the invention, it is provided that, for the etching, a YAG type laser is used, emitting in the infrared range at the 1.06 μm wavelength. In this case, said laser beam is swept over the connector in a path that enables the drawing of the pattern corresponding to said particulars that are to be marked. The metal is evaporated under thermal effect, the total control achieved over the power of the beam providing for the possibility of limiting the depth of the etching to a very low value. Typically, the depth of the etching will be reduced so that the totality of the coating of the metal contacts is not removed. This configuration permits very great flexibility in the programming of the message:for example it permits units to be identified individually.

Examples that may be cited of particulars that can be marked on the card include a trade mark or the manufacturer's company name or again an identification designed to prevent any act of falsification. In the last-mentioned case, the invention provides for:

recognizing identification particulars memorized in said chip;

marking said identification particulars on the connector;

marking the identification particulars also on the card.

BRIEF DESCRIPTION OF THE DRAWINGS

The following description, made with reference to the appended drawings which are given as non-restrictive examples, will provide for a clear understanding of the content of the invention and of the way in which it can be achieved.

FIG. 1 shows a sectional view of an electronic chip card micromodule;

FIG. 2 is a top view corresponding to the sectional view of FIG. 1;

FIG. 3 is a schematic view in perspective of a marking device that implements the method of the invention by means of a YAG type laser.

FIG. 4 is a schematic sectional view of a marking device that implements the method of the invention by means of an excimer laser.

FIG. 5 is a sectional view of a metal contact after marking according to the method of the invention.

FIG. 6 is a drawing of a programmed marking device implementing the method of the invention.

MORE DETAILED DESCRIPTION

FIG. 1 shows a sectional view of a micromodule 10 placed inside a cavity 2 made in the body of a card 1 known as an electronic chip card. This micromodule 10 has a connector 11 constituted by a set of metal contacts 12 deposited on a support is made of epoxy resin. The various metal contacts 12 are separated from one another by insulator lines 13 and are connected to an electronic component 16, which is the chip of card 1, by conductive wires 14. As can be seen in FIG. 5, the metal contacts 13 may be formed by a main layer 120 of copper with a thickness of about 70 µm coated on each side with a 1 µm nickel layer 121 and a 0.1 µm gold layer 122. The coating of the copper layer 120 with nickel and gold is used notably to prevent the corrosion of copper through contact with the ambient atmosphere.

FIGS. 3 and 4 give a schematic view of two devices for the implementation of a method for the marking of particulars, referenced 20 in FIGS. 2, 3 and 4, on the connector 11 of the electronic chip card 1, said method comprising a step that consists of the etching, with a laser beam 30, of said particulars 20 in the thickness of the metal contacts 12 of the connector 11.

In FIG. 3, the etching laser beam 30 comes from a YAG type laser L1 emitting an infrared radiation at a wavelength of 1.06 µm. The laser beam 30 is focused on metal contacts 12 by a lens 40 forming, in its focal plane, a image dot that can have a diameter of 70 µm. The etching is obtained by the sweeping, for example with an overlapping of 10 to 30 µm between successive image dots, of said laser beam 30 over the connector 11 along a trajectory enabling the drawing of the pattern corresponding to said particulars that are to be marked. In the device shown in FIG. 3, the sweeping is achieved by means of two deviation mirrors or tilted mirrors Mx, My pivoting respectively about two orthogonal axes Ax and Ay. Naturally, the rotations of the mirrors Mx and My as well as their synchronization may be controlled digitally on the basis of the particulars 20 that are to be marked.

The device of FIG. 4 uses an excimer laser L2 emitting an ultraviolet radiation at the wavelength of 308 nm for example. An image of a mask 50, perforated according to a pattern corresponding to the particulars 30 that are to be marked, is formed on the connector 11 by means of a lens 51.

The power of the laser beam used needs to be perfectly controlled so that, as indicated in FIG. 5, the depth of the etched particulars 20 does not penetrate the copper layer 120 but remains localized at the upper layers 121, 122 of nickel and gold, in order to prevent the corrosion of the contacts. To this end, there is provision, for example, for using a continuous device and for modulating said laser beam in order to limit the etching power. This modulation can be done by chopping the supply of the laser L, as can be seen FIG. 6. It is clear, however, that other means can be implemented to modulate the laser beam, such as Kerr effect or Pockels effect electrooptical modulators.

In order to adjust the etching power as a function of the thickness of the metal contacts 12, it is possible to modify the cyclical ratio of the modulation. FIG. 6 shows that this adjusting operation can be done automatically by a microprocessor 60 controlled by a working program stored in a read-only memory 61.

Naturally, the step for the etching of the metal contacts 12 of the connector 11 can be done at any stage of the preparation of the card 1. In particular, it can be planned that the micromodule 10 comprising said connector and the associated electronic chip 16 are made prior to said etching step. Indeed, since the marking method according to the invention does not jeopardize the chip itself, its implementation can be considered even at an advanced stage of the manufacture of the card.

FIG. 6 shows that it is even possible to carry out the etching step after the micromodule 10 has been mounted on the body of the card 1. It can also be seen in FIG. 6 that, in this case, it is possible, by means of sensors 71, 72, to recognize identification particulars to be marked that are recorded electrically in the chip 16 and to transmit them to the microprocessor 60 which, apart from the modulation of the laser L, controls the means 80 for the sweeping of the laser beam 30 along x and y as a function of the particulars received. These identification elements may thus be etched on the metal contacts 12 of the micromodule 10 as well as on the very body of the card 1, thus forming a security means by which the interchanging of the micromodule 10 and the card 1 can be avoided.

What is claimed is:

1. A chip card protected against micromodule replacement, said chip card comprising:
   a chip card body; and
   a micromodule, said micromodule being housed in said chip card body, said micromodule including
      a chip, and
      a connector having a metal contact, said metal contact being electrically connected to said chip for communicating electrical signals, said metal contact further including
         a main layer, said main layer being free of etched information elements, and
         a coating layer, said coating layer being adjacent to and covering said main layer, and said coating layer having information elements etched therein.

2. A chip card as in claim 1, wherein said information elements are laser-etched in said coating layer.

3. A chip card as in claim 1, wherein said information elements etched in said coating layer are based on information electrically stored in said chip.

4. A chip card as in claim 1, wherein an outer surface of said chip card body has information elements marked thereon which match said information elements of said coating layer.

5. A chip card as in claim 1, wherein said information elements etched in said coating layer are based on information electrically stored in said chip, and wherein an outer surface of said chip card body has information elements marked thereon which match said information elements of said coating layer.

6. A chip card as in claim 5, wherein said metal contact defines means for communicating said information stored in said chip to a marking device which etches said information elements in said coating layer.

7. A chip card as in claim 5, wherein said information elements marked on said chip card body are etched therein.

8. A chip card as in claim 1, wherein information elements are also marked on said chip card body, and wherein said information elements etched on said coating layer and said information elements marked on said chip card body define means for indicating whether said micromodule has been replaced.

9. A chip card as in claim 1, wherein said information elements are etched in said coating layer when said chip and said connector are mounted in said chip card body.

10. A connector adapted for protecting a chip card against micromodule replacement, said connector comprising
- a first metal contact, said first metal contact being electrically coupled to a chip;
- a second metal contact, said second metal contact being electrically coupled to said chip, said second metal contact communicating electrical signals to said chip, and said metal contact further including
  - a main layer, said main layer being free of etched information elements,
  - a coating layer, said coating layer being adjacent to and covering said main layer, and said coating layer having information elements etched therein.

11. A connector as in claim 10, wherein said information elements are laser-etched in said coating layer.

12. A connector as in claim 10, wherein said information elements etched in said coating layer are based on information electrically stored in said chip.

13. A connector as in claim 10, wherein said connector is housed in a chip card body, and wherein an outer surface of said chip card body has information elements marked thereon which match said information elements of said coating layer.

14. A connector as in claim 10, wherein said information elements etched in said coating layer are based on information electrically stored in said chip, wherein said connector is housed in a chip card body, and wherein an outer surface of said chip card body has information elements marked thereon which match said information elements of said coating layer.

15. A connector as in claim 10, wherein
said second metal contact is flat and has two sides,
said main layer is formed of copper and is approximately 70 μm thick,
said coating layer is formed of a nickel sub-layer and a gold sub-layer, said nickel sub-layer surrounding said main layer and said gold sub-layer surrounding said nickel sub-layer, and said nickel sub-layer being approximately 1 μm thick and said gold sub-layer being approximately 0.1 μm thick.

16. A connector as in claim 10, wherein said information elements etched on said coating layer are in the shape of a mask used to etch said information elements.

17. A chip card protected against micromodule replacement, said chip card comprising:
- a chip card body, said chip card body having a cavity formed therein, and an outer surface of said chip card body having information elements marked thereon; and
- said micromodule, said micromodule being housed in said cavity of said chip card body, said micromodule further including
  - a chip, and
  - a connector having a first metal contact and a second metal contact, said first metal contact and said second metal contact being electrically connected to said chip for communicating electrical signals, said first metal contact further including
    - an inner layer, said inner layer being free of laser-etched information elements, and
    - an outer layer, said outer layer covering said inner layer, and said outer layer having information elements laser-etched therein which correspond to said information elements marked on said chip card body;

and wherein said information elements on said outer layer and said information elements marked on said chip card body define means for indicating whether said micromodule has been replaced.

18. A chip card as in claim 17, wherein said information elements etched in said outer layer are based on information electrically stored in said chip.

19. A chip card as in claim 17, wherein said information elements marked on said chip card body are laser-etched therein.

20. A chip card as in claim 17, wherein said information elements etched in said outer layer are in the shape of a mask used to etch said information elements.

* * * * *